(12) United States Patent
Ikeda et al.

(10) Patent No.: US 8,054,645 B2
(45) Date of Patent: Nov. 8, 2011

(54) PLUG-IN UNIT-MOUNTING STRUCTURE AND ELECTRONIC APPARATUS

(75) Inventors: Katsuhiko Ikeda, Kawasaki (JP);
Yoshiyuki Sato, Kawasaki (JP); Wataru Takano, Kawasaki (JP); Hideo Araki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 501 days.

(21) Appl. No.: 12/318,588

(22) Filed: Dec. 31, 2008

(65) Prior Publication Data
US 2009/0231824 A1 Sep. 17, 2009

(30) Foreign Application Priority Data
Mar. 12, 2008 (JP) ................................. 2008-062698

(51) Int. Cl.
*H05K 7/14* (2006.01)
(52) U.S. Cl. ........................................ 361/802; 385/135
(58) Field of Classification Search .................. 361/802; 385/135, 134
See application file for complete search history.

(56) References Cited

U.S. PATENT DOCUMENTS

| | | | |
|---|---|---|---|
| 5,216,578 A | 6/1993 | Zenitani et al. | |
| 5,818,696 A * | 10/1998 | Knoop | 361/730 |
| 6,359,789 B1 | 3/2002 | Imabayashi et al. | |
| 6,552,915 B2 | 4/2003 | Takahashi et al. | |
| 6,580,616 B2 * | 6/2003 | Greenside et al. | 361/752 |
| 7,889,508 B2 * | 2/2011 | Sato et al. | 361/756 |
| 2002/0145858 A1 * | 10/2002 | Hayashi et al. | 361/798 |
| 2005/0265010 A1 * | 12/2005 | Bundza et al. | 361/796 |
| 2007/0139903 A1 * | 6/2007 | Waltz et al. | 361/802 |
| 2007/0230889 A1 * | 10/2007 | Sato et al. | 385/135 |
| 2008/0043451 A1 * | 2/2008 | Sato et al. | 361/802 |

FOREIGN PATENT DOCUMENTS

| | | | |
|---|---|---|---|
| JP | 4-113693 | | 4/1992 |
| JP | 2005-277281 | | 10/2005 |
| JP | 2008047716 A | * | 2/2008 |
| JP | 2009218487 A | * | 9/2009 |
| WO | WO 00/74454 | | 7/2000 |

OTHER PUBLICATIONS

Patent Abstracts of Japan, Publication No. 04-113693, published Apr. 15, 1992.
Patent Abstracts of Japan, Publication No. 2001-119177, published Apr. 27, 2001.
Patent Abstracts of Japan, Publication No. 2005-277281, published Oct. 6, 2005.
Patent Abstracts of Japan, Publication No. 06-252575, published Sep. 9, 1994.
Patent Abstracts of Japan, Publication No. 2008-047716, published Feb. 28, 2008.

* cited by examiner

*Primary Examiner* — Lisa Lea Edmonds
(74) *Attorney, Agent, or Firm* — Staas & Halsey LLP

(57) ABSTRACT

A plug-in unit-mounting structure which makes it possible to efficiently accommodate plug-in units without being dependent on the structure of a shelf. The plug-in unit-mounting structure comprises a shelf that has connectors disposed on a back wiring board, for being fitted to the plug-in units, and at least one mounting frame that is mounted in the shelf, for each accommodating an associated one of the plug-in units, and enabling the plug-in unit to be inserted in and removed from an associated one of the connectors, the mounting frame being provided with a guide rail which enables a position of disposition of the plug-in unit to be changed according to a size of the plug-in unit. This makes it possible to efficiently accommodate plug-in units without being dependent on the structure of a shelf.

13 Claims, 15 Drawing Sheets

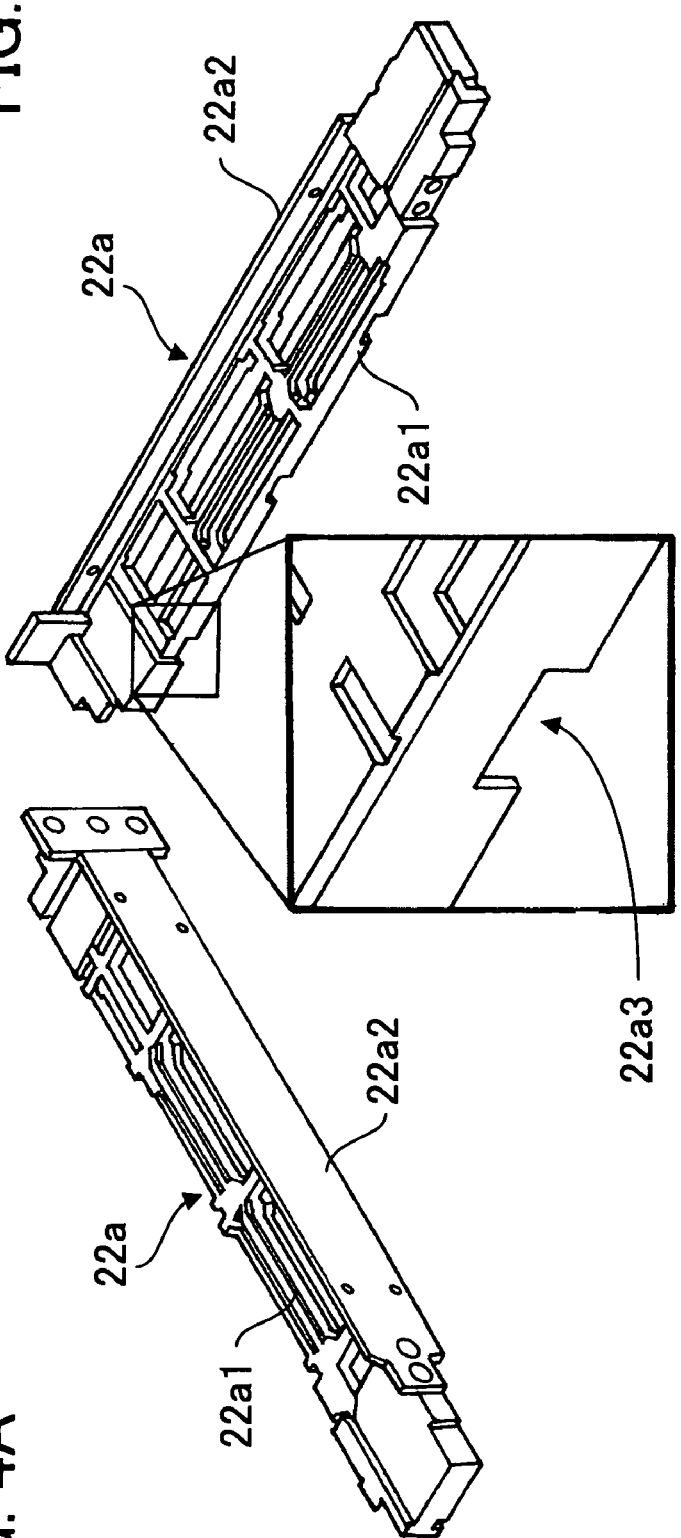

PLUG-IN UNIT-MOUNTING STRUCTURE AND ELECTRONIC APPARATUS

CROSS-REFERENCE TO RELATED APPLICATIONS

This application is based upon and claims the benefits of priority from the prior Japanese Patent Application No. 2008-062698, filed on Mar. 12, 2008, the entire contents of which are incorporated herein by reference.

BACKGROUND OF THE INVENTION

1. Field of the Invention

This invention relates to a plug-in unit-mounting structure and an electronic apparatus, and more particularly to a plug-in unit-mounting structure for mounting plug-in units having various circuit packages mounted on printed circuit boards thereof, and an electronic apparatus.

2. Description of the Related Art

Electronic apparatuses for communication, such as transmitters and switchboards, use a bookshelf-type electronic apparatus in which a plurality of printed circuit board units (hereinafter referred to as "plug-in units (PIUS) each having electronic circuit packages are vertically mounted on a back wiring board (BWB) mounted on the rear face of a metal shelf thereof. The PIU comprises a printed circuit board and a plurality of electronic circuit packages each formed with electronic circuits, such as LSIs (Large-Scale Integrated circuits), mounted on the printed circuit board. There have been already proposed several plug-in unit-mounting techniques for mounting PIUs on the BWB.

FIG. 13 is a front view of an example of a plug-in unit-mounting structure.

In a metal shelf 100, respective sets of substantially C-shaped upper and lower guide rails 103a and 103b are secured to upper and lower sides 101 and 102 thereof in a manner opposed to each other at equally-spaced intervals. Box-shaped full-size PIUs 104 can be vertically mounted in the metal shelf 100 using the upper guide rails 103a and the lower guide rails 103b as guides. Further, center rails 105 are provided between associated ones of the upper and lower guide rail 103a and 103b of the metal shelf 100 as intermediate guide members. With this arrangement, half-size box-shaped PIUs 106 can be vertically mounted at respective upper shelves of the metal shelf 100 using the upper guide rails 103a and the center rails 105 as guides. Similarly, half-size box-shaped PIUs 107 can be mounted at respective lower shelves using the center rails 105 and the lower guide rails 103b as guides (see e.g. the pamphlet of International Publication WO 00/074454 (Section of [Brief Description of the Construction of Telecommunications Apparatus 10] in PREFERRED EMBODIMENTS FOR WORKING THE INVENTION, and FIG. 1)).

Thus, PIUs 104, 106 and 107 having different sizes can be mounted on the BWB (not shown) of the metal shelf 100 shown in FIG. 13, and hence it is possible to simplify the design of e.g. a package-type communication apparatus, which improves not only economy but also the convenience of maintenance.

FIG. 14 is a front view of another example of the plug-in unit-mounting structure.

In a metal shelf 200, guide rails 202 are not mounted on the upper and lower sides, but are mounted on a BWB 201 in a cantilever manner such that they protrude forward and are inwardly opposed to each other. Box-shaped PIUs 203 and 204 having bar-shaped guides (not shown) mounted along two opposed sides which are orthogonal to a side where connectors are mounted can be vertically mounted in the metal shelf 200 using the guide rails 202 as guides. The vertical distances between locations where the guide rails 202 are mounted are determined in a manner adapted to the sizes of the PIUs to be mounted (see e.g. Japanese Unexamined Patent Publication No. H04-113693 (fourth and fifth pages, and FIGS. 1 and 3).

Thus, the metal shelf 200 shown in FIG. 14 is configured such that the guide rails 202 are mounted on the BWB 201 in a manner adapted to the sizes of the PIUs 203 and 204 having different sizes. Therefore, the PIUs 203 and 204 can be mounted on the metal shelf 200 in high density without the waste of space.

FIG. 15 is a front view of still another example of the plug-in unit-mounting structure.

Respective sets of substantially C-shaped guide rails 303a and 303b are secured to an upper side 301 and a lower side 302 of a metal shelf 300 in a manner opposed to each other. Printed circuit board-type full-size PIUs 304 can be vertically mounted on the metal shelf 300 using the guide rails 303a and 303b as guides. Further, some of the guide rails 303a and 303b secured to the metal shelf 300 hold mounting frames 305 for the PIUs 306 and 307. Each mounting frame 305 has center rails 305a and 305b integrally formed therewith, and grooves 305c formed in the top and bottom thereof, for engagement with the guide rails 303a and 303b (see e.g. Japanese Unexamined Patent Publication No. 2005-277281 (Paragraph Numbers [0010] to [0024] and FIG. 1)).

As described above, in the metal shelf 300 shown in FIG. 15, by using the mounting frame 305, half-size PIUs 306 of printed circuit board type can be mounted at upper shelves by each being guided between the guide rail 303a and the center rail 305a of the mounting frame 305. Similarly, half-size PIUs 307 of printed circuit board type other than those 306 can be also mounted on lower shelves by each being guided between the guide rail 303b and the center rail 305b of the mounting frame 305.

In the illustrated example, only by fixing the guide rails 303a and 303b to opposed sides of the metal shelf 300, it is possible to cope with PIUs having different sizes. Therefore, as distinct from the case of the metal shelf 100 shown in FIG. 13, it is not necessary to provide the center rails 105 thereto as the intermediate guide members, which makes it possible to perform high-density mounting using a smaller number of components. Further, as distinct from the metal shelf 200 shown in FIG. 14, it is not required to mount each guide rail 202 on the BWB 201 in a manner adapted to the size of a PIU 203. Therefore, even when the PIUs 304, 306 and 307 already mounted in the metal shelf 300 are replaced by PIUs having different sizes, it is possible to easily mount PIUs having desired widths at predetermined locations.

However, in both of the above-described plug-in unit structure shown in FIGS. 13 and 15, the guide rails for guiding the PIUs to the BWB are mounted on the metal shelves themselves. In general, the number of layers of a printed circuit board increases or decreases depending on the amount of wiring, and hence as the amount of wiring becomes larger, the size of the printed circuit board in the direction of the thickness thereof inevitably tends to increase. Therefore, in the cases of the metal shelves 100 and 300, there is a problem that existing guide rails are not suitable for the mounting of a PIU on which is mounted a different printed circuit board increased in size in the direction of thickness thereof and having a larger amount of wiring.

Further, in the case of the metal shelf 300 shown in FIG. 15, if a PIU has a different thickness, as in the case of a PIU in which a heat sink provided with a radiation fin is arranged on a printed circuit board, it is not easy to mount the PIU on the metal shelf 300. What is more, when mounting a box-shaped PIU without containing a printed circuit board to begin with, it is required to provide guide rails for guiding the box-shaped PIU in place of the fixed guide rails 303a and 303b.

On the other hand, the FIG. 14 metal shelf 200 for mounting the box-shaped PIUs 203 and 204 is adapted only to the box-shaped PIUs 203 and 204, and hence it is impossible to mount PIUs having a printed circuit board exposed without being covered with a box-shaped covering. Further, since the opposed guide rails 202 are separately fixed to the BWB 201, and hence, the distance between the opposed guide rails is sometimes not uniform due to variations of parts thereof.

As described above, the above-described electronic apparatuses suffer from the problem that it is not easy to replace PIUs mounted on a shelf or increase or reduce the number of mounting frames e.g. when changing the design of the apparatuses.

SUMMARY OF THE INVENTION

The present invention has been made in view of the above-described problems, and an object thereof is to provide a plug-in unit-mounting structure which makes it possible to efficiently accommodate plug-in units without being dependent on the structure of a shelf.

Another object of the invention is to provide an electronic apparatus in which plug-in units that can be mounted in slots of shelves have a high freedom of design in changing the design thereof.

To attain the above object, there is provided a plug-in unit-mounting structure for mounting plug-in units having various circuit packages mounted on printed circuit boards thereof. The plug-in unit-mounting structure comprises a shelf that has connectors disposed on a back wiring board, for being fitted to the plug-in units, and at least one mounting frame that is mounted in the shelf, for each accommodating an associated one of the plug-in units, and enabling the plug-in unit to be inserted in and removed from an associated one of the connectors, the mounting frame being provided with a guide rail which enables a position of disposition of the plug-in unit to be changed according to a size of the plug-in unit.

Further, to attain the other object, there is provided an electronic apparatus having various circuit packages mounted on printed circuit boards thereof, comprising a shelf having a back wiring board on which connectors are disposed, plug-in units which are capable of being inserted in and removed from the connectors, a mounting frame that accommodates an associated one of the plug-in units, the mounting frame being provided with a guide rail which enables a position of disposition of the plug-in unit to be changed according to a size of the plug-in unit, the mounting frame being positioned with respect to the frame and fixed thereto.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 1A and 1B are views useful in explaining an outline of embodiments of the present invention, in which FIG. 1A is a schematic plan view of a plug-in unit-mounting structure, and FIG. 1B is a schematic perspective view of a mounting frame;

FIGS. 3A and 3B are views showing a mounting frame mounted on a shelf of the plug-in unit-mounting structure according to the first embodiment, in which FIG. 3A is a schematic perspective view of the mounting frame, and FIG. 3B is an enlarged schematic perspective view of an engaging portion;

FIGS. 4A, 4B, and 4C are views showing a center guide rail which is removable from the mounting frame of the plug-in unit-mounting structure according to the first embodiment, in which FIG. 4A is a schematic perspective view of the center guide rail as viewed from the right front side, FIG. 4B is a schematic perspective view of the center guide rail as viewed from the left front side, and FIG. 4C is an enlarged schematic perspective view of a cutout portion;

DESCRIPTION OF THE PREFERRED EMBODIMENTS

Figure 1A:
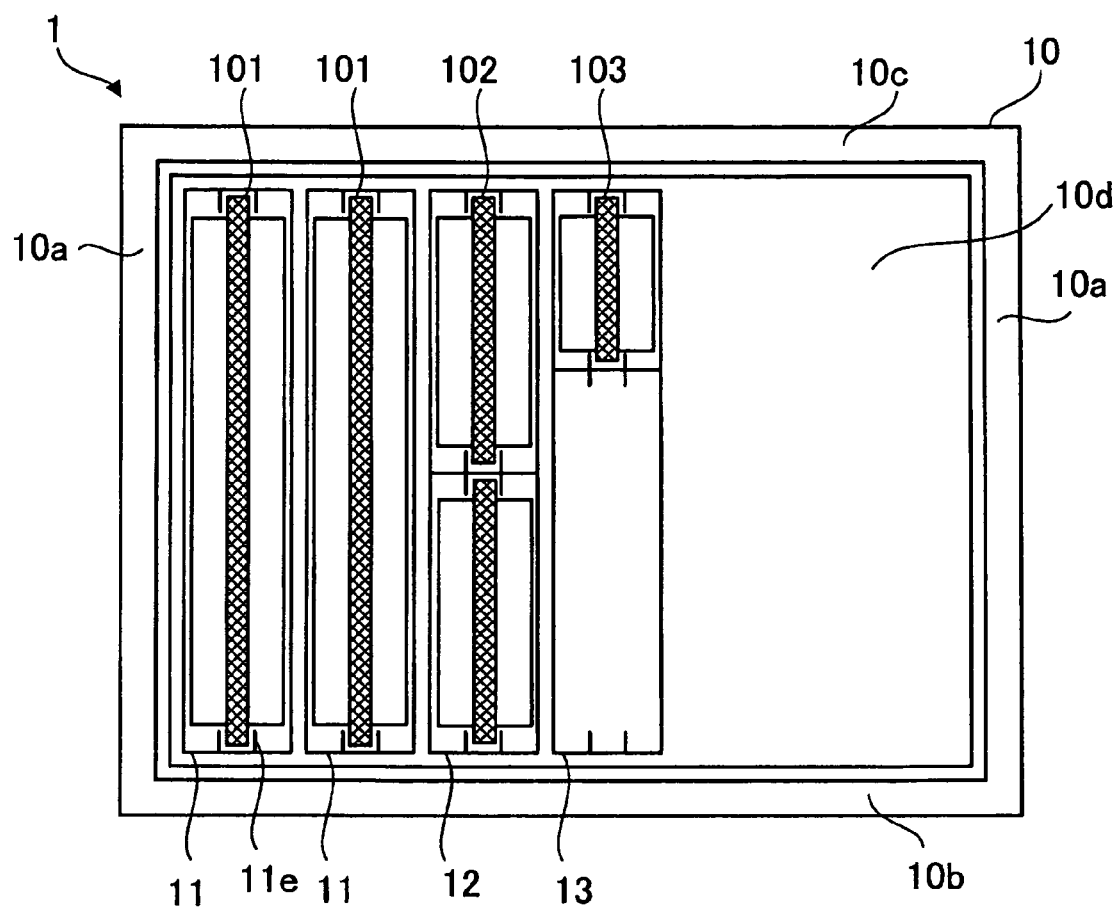

The invention will now be described in detail with reference to drawings showing preferred embodiments thereof. It should be noted that the technical scope of the present invention is by no means limited to the preferred embodiments. In the following drawings, identical or corresponding component elements shown in the following drawings are denoted by identical reference numerals.

First, a description will be given of an outline of embodiments of the present invention.

Figure 1B:
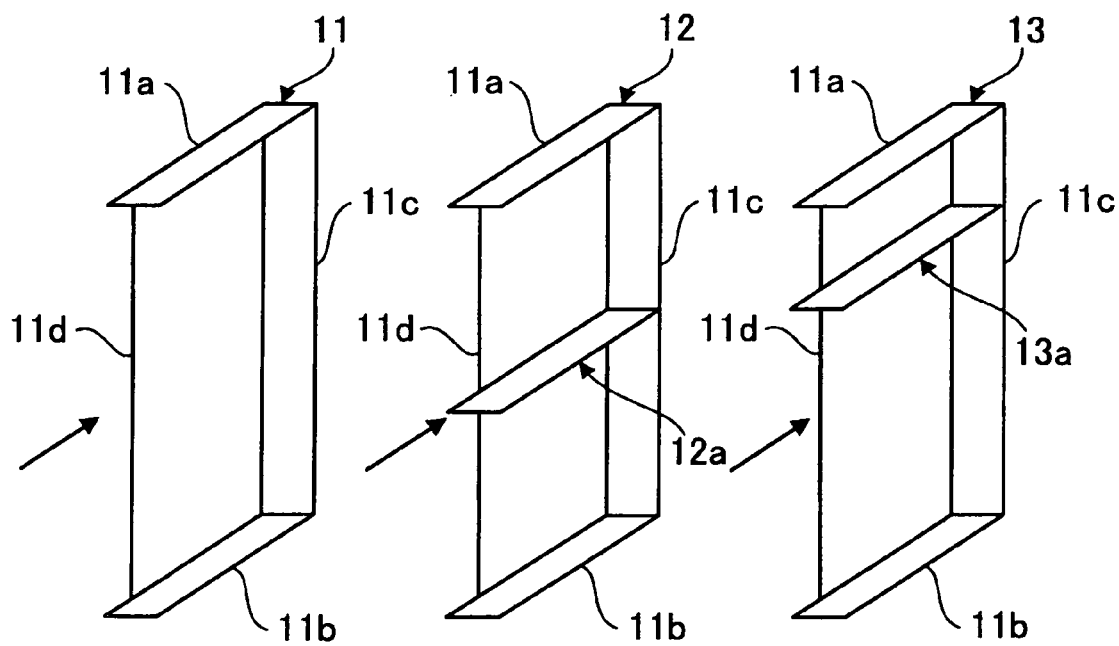

FIGS. 1A and 1B are views useful in explaining an outline of the embodiments, in which FIG. 1A is a schematic plan view of a plug-in unit-mounting structure, and FIG. 1B is a schematic perspective view of a mounting frame. It should be noted that an arrow in FIG. 1B represents a direction in which a plug-in unit (PIU) is accommodated into the mounting frame.

In a plug-in unit-mounting structure 1, as shown in FIG. 1, printed circuit board-type PIUs 101, 102, and 103 are accommodated in a shelf 10 side by side in the longitudinal direction of the shelf 10 via respective mounting frames 11, 12, and 13.

The shelf 10 forms a sub-rack having a pair of side boards 10a, a bottom board 10b, a top board 10c having a rear side thereof inclined upward, and a back wiring board (BWB) 10d. It should be noted that connectors (not shown) are disposed on the BWB 10d.

By the way, the PIUs 101, 102, and 103 which are accommodated in the shelf 10 have various sizes, such as a full size, a half size which has a height which is half the height of the full size, and a quarter size which has a height which ie still half the height of the half size. Therefore, the PIUs 101, 102, and 103 are accommodated in the shelf 10 via the mounting frames which are adapted to the respective heights thereof. More specifically, as shown in FIG. 1A, the PIUs 101, 102, and 103 are accommodated in the shelf 10 via the mounting frame 11 which is capable of having the full-size PIU 101 mounted thereon, the mounting frame 12 which is capable of having the half-size PIU 102 mounted thereon, the mounting frame 13 which is capable of having the quarter-size PIU 103 mounted thereon. It should be noted that each of the mounting frames 11, 12, and 13 has a pair of inward-facing guide rails 11e provided at respective locations of upper and lower sides opposed to each other. By using the guide rails 11e as guides, the PIUs 101, 102, and 103 can be smoothly mounted on the mounting frames 11, 12, and 13, respectively.

FIG. 1B is a schematic perspective view of the mounting frames 11, 12, and 13. It should be noted that the guide rails 11e are not shown in FIG. 1B. These mounting frames 11, 12, and 13 each comprise a vertical frame part 11c having a length corresponding to the height of the shelf 10, an upper frame part 11a and a lower frame part 11b horizontally fixed to the respective upper and lower ends of the vertical frame part 11c, and a side partition board 11d which separates between PIUs mounted adjacent to each other in the shelf 10. Further, the mounting frames 12 and 13 have respective center guide rails 12a and 13a disposed therein. The center guide rails 12a and 13a can be each disposed on the side partition board lid according to the height of a PIU to be accommodated thereon such that one end thereof is in contact with the vertical frame part 11c. Therefore, the center guide rail 12a is parallel to the upper frame part 11a and the lower frame part 11b, and orthogonal to the vertical frame part 11c. Further, the center guide rails 12a and 13a are removable as desired, and can be freely mounted on the side partition board 11d, such that one end thereof is brought into contact with the vertical frame part 11c. Therefore, when the full-size PIU 101 is accommodated, the mounting frame 11 without a center guide rail is used. On the other hand, when the half-size PIU 102 is accommodated, the mounting frame 12 having the center guide rail 12a disposed therein such that one end of the center guide rail 12a is in contact with a substantially central portion of the vertical frame part 11c is used, and when the quarter-size PIU 103 is accommodated, the mounting frame 13 having the center guide rail 13a disposed therein such that one end of the center guide rail 13a is in contact with a portion of the vertical frame part 11c at a location spaced from the upper frame part 11a by a quarter of the height of the vertical frame part 11c is used. Thus, the PIUs 101, 102, and 103 can be accommodated in the shelf 10 via the mounting frames 11, 12, and 13 which are adapted to the respective heights of the PIUs. Then, the PIUs 101, 102, and 103 accommodated in the shelf 10 are fitted in respective associated connectors disposed on the BWB 10d. It should be noted that although FIG. 1 shows a case of one center guide rail 13a being disposed in the mounting frame 13, but a plurality of the center guide rails 13a may be disposed in the mounting frame 13.

Therefore, according to the plug-in unit-mounting structure, when accommodating the PIUs in the shelf, the mounting frames which are removably mounted in the shelf are used, whereby it is possible to efficiently accommodate the PIUs by guiding the same along the guide rails provided on the mounting frames. Further, it is possible to dispose the center guide rail which is removable from the mounting frame in the mounting frame in a manner adapted to the height of the PIU. Therefore, it becomes unnecessary to perform fixed mounting of PIUs in a factory, reduce the number of manufacturing steps by reduction of the number of types of parts required to be prepared for assembly, and replace mounting frames for replacement of a mounted PIU after shipment.

First Embodiment

A description will be given of a first embodiment of the present invention. The first embodiment will be described by taking an example of a plug-in unit-mounting structure in the light of the above-described outline. It should be noted that all PIUs according to the first embodiment are equal in width, and the width is defined as "the single-size width" (length in a direction orthogonal to the height and length of a PIU in the mounted state).

Figure 2:
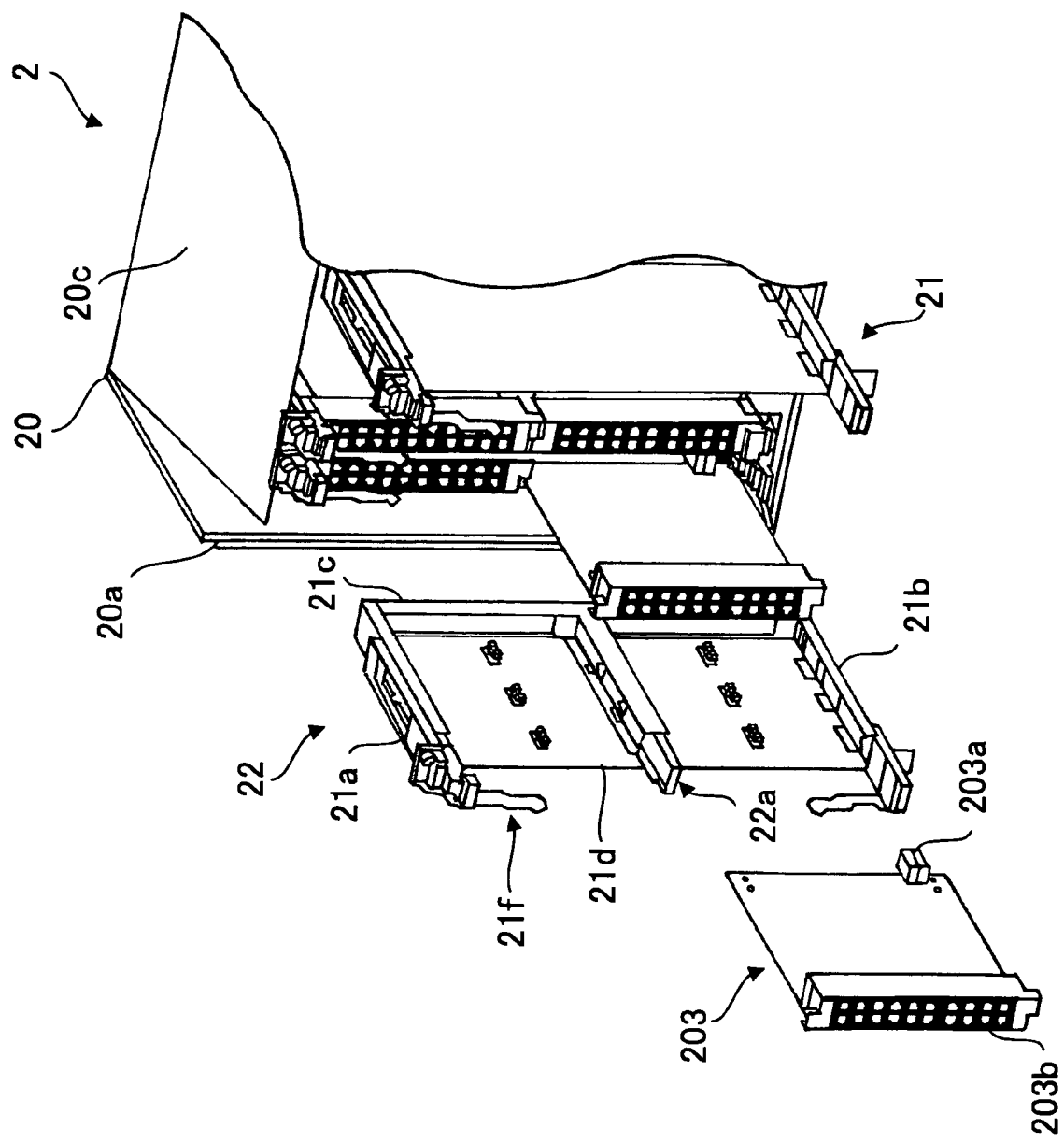
FIG. 2 is a schematic perspective view of a plug-in unit-mounting structure according to a first embodiment of the present invention.

FIG. 2 is a schematic perspective view of the plug-in unit-mounting structure according to the first embodiment of the present invention.

In this plug-in unit-mounting structure 2, connectors (not shown) which can be fitted to the PIUs are disposed on a BWB (not shown) of a metal shelf 20, and mounting frames 21 and 22 adapted to various PIUs are accommodated side by side in the longitudinal direction of the metal shelf 20 in a predetermined arrangement.

The mounting frames 21 and 22 each include a vertical frame part 21c to be pushed in toward the BWB, and an upper frame part 21a and a lower frame part 21b horizontally fixed to respective upper and lower ends of the vertical frame part 21c and having a length corresponding to the depth of the metal shelf 20. In addition to these components, the mounting frame 22 further includes a center guide rail 22a horizontally fixed to a desired intermediate position of the vertical frame part 21c. The mounting frame 21 and 22 are formed with guide rail portions (not shown) for guiding the PIU along the upper frame part 21a and the lower frame part 21b, and a side partition board 21d. In the present embodiment, the guide rail portions are formed by shaping metal sheets such that they protrude upward, but they may be formed e.g. by attaching separate parts formed by grooving a resin or the like. The side partition board 21d is provided for separation from an adjacent PIU mounted in the metal shelf 20. This makes it possible to prevent the whole electronic apparatus being burned out even when a circuit device of the adjacent PIU produces a fire or suffers from an accident of burning, as well as protect the internal circuit packages from being thermally affected by each other.

Further, the mounting frames 21 and 22 each have a card lever 21f disposed thereon in a manner associated with a front slot of the metal shelf 20, for inserting and removing the PIU. The card lever 21f is provided at each of respective front ends of the upper frame part 21a and the lower frame part 21b of the mounting frames 21 and 22, and enables an inserting or removing force to be applied to the PIU in pushing the inserted PIU toward the BWB or in drawing the same in an opposite direction.

The PIU 203 has a height (half size) which is half the height of the full-size PIU to be mounted on the BWB of the metal shelf 20. The width of the PIU 203 is assumed to be the single-size width. The PIU 203 is provided with a plug-in connector 203a provided at an end side thereof in a direction of insertion when mounting the PIU 203 in the mounting frame 22, and a front panel (display board) 203b at an end side opposite thereto. It should be noted that the mounting frame 21 is for a full-size PIU. Further, the full-size PIU (not shown) is provided with a connector and a front panel similarly to the PIU 203, and has the single-size width. The full-size PIU is inserted into the metal shelf 20 from a predetermined front slot thereof via the mounting frame 21 to be accommodated therein.

Next, a description will be given of details of the mounting frames.

Figures 3A, 3B:
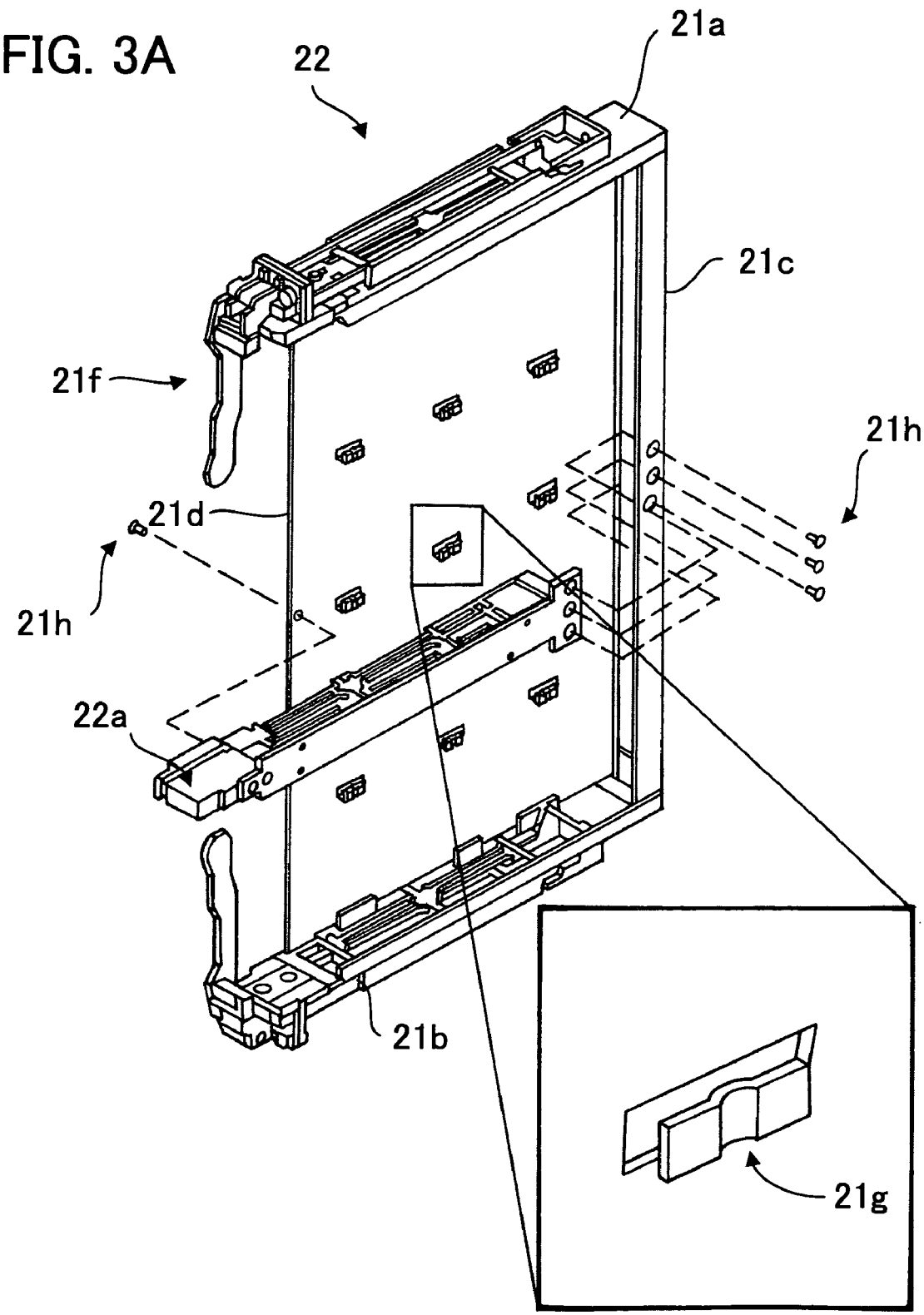

FIGS. 3A and 3B are views showing a mounting frame mounted in the shelf of the plug-in unit-mounting structure according to the first embodiment of the present invention, in which FIG. 3A is a schematic perspective view of the mounting frame, and FIG. 3B is an enlarged schematic perspective view of an engaging portion. It should be noted that FIGS. 3A and 3B show the mounting frame 22 in a state where the center guide rail has not been disposed. Therefore, the center guide rail is shown in a manner spaced apart from the side partition board on purpose.

As described above, the mounting frame 22 includes the vertical frame part 21c to be pushed in toward the BWB, the upper and lower frame parts 21a and 21b horizontally fixed to the respective upper and lower ends of the vertical frame part 21c and having a length corresponding to the depth of the metal shelf 20, with the guide rail portions provided thereon for guiding the PIU 203, the card lever 21f provided at each of respective front ends of the upper frame part 21a and the lower frame part 21b, and the side partition board 21d provided for separation from an adjacent PIU mounted in the metal shelf 20. It should be noted that the card lever 21f is provided at each of respective front ends of the upper frame part 21a and the lower frame part 21b in a manner adapted to a connector disposed on the BWB in which the PIU 203 is to be fitted via the mounting frame 22. Further, the side partition board 21d is formed with hook-shaped engaging portions 21g in a manner protruding from a side on which the PIU is mounted. The three engaging portions 21g are formed such that the openings of respective hooks thereof are arranged in line in one direction, and three lines of the engaging portions 21g are formed at equal space intervals. Further, the mounting frame 22 is provided with the center guide rail 22a. As shown in FIG. 3, the center guide rail 22a is engaged with the engaging portions 21g such that it extends horizontally to a desired position of the vertical frame part 21c, and is fixed to the side partition board 21d and the vertical frame part 21c by screws 21h.

Next, a description will be given of details of the center guide rail.

Figure 5:
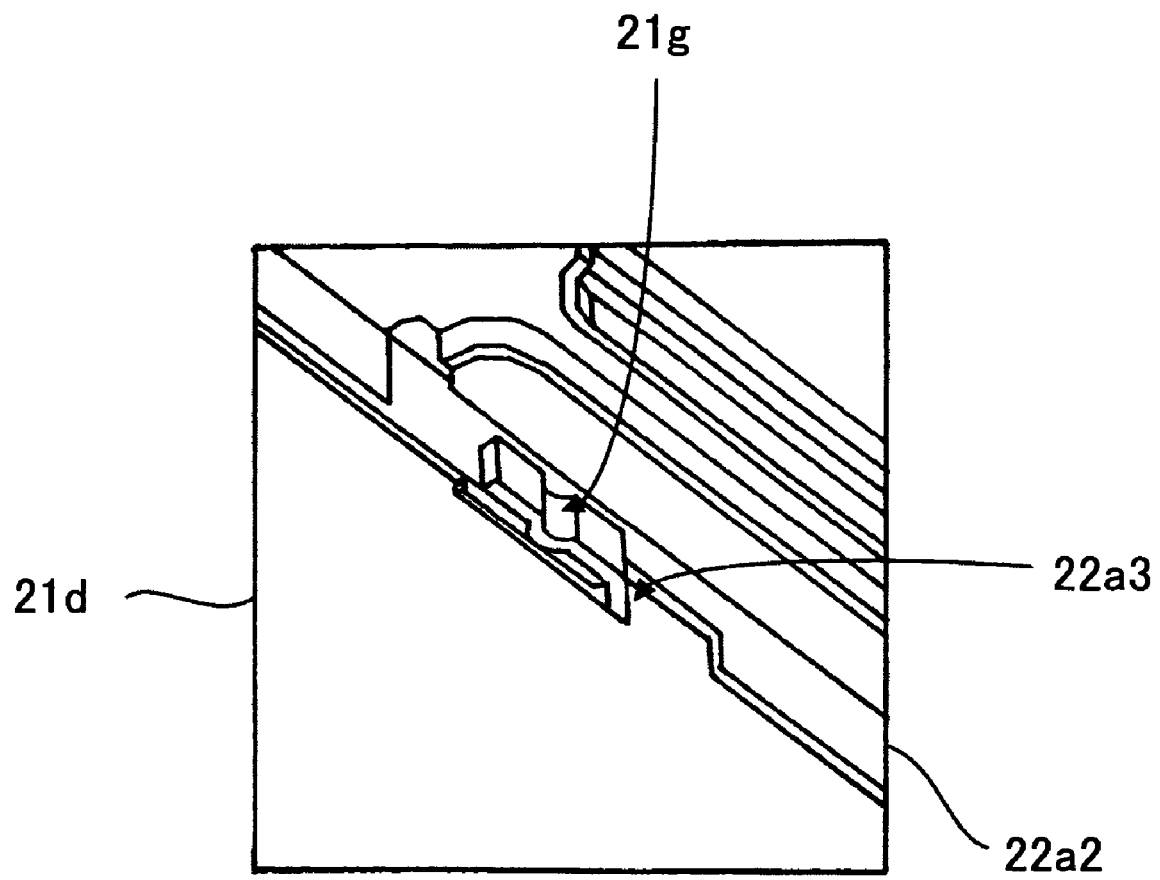
FIG. 5 is an enlarged schematic perspective view of a portion where the center guide rail and a side partition board are engaged in the first embodiment.

FIGS. 4A, 4B, and 4C are views showing the center guide rail which is removable from the mounting frame of the plug-in unit-mounting structure according to the first embodiment, in which FIG. 4A is a schematic perspective view of the center guide rail as viewed from the right front side, FIG. 4B is a schematic perspective view of the center guide rail as viewed from the left front side, and FIG. 4C is an enlarged schematic perspective view of a cutout portion. FIG. 5 is an enlarged schematic perspective view of a portion where the center guide rail and a side partition board are engaged in the first embodiment.

The center guide rail 22a includes a rail member 22a1 which guides the PIU 203 in cooperation with the upper frame part 21a or the lower frame part 21b, and a contact surface member 22a2 formed substantially orthogonal to the rail member 22a1. Cutout portions 22a3 are formed in three portions of the rail member 22a1. Therefore, as shown in FIG. 5, the center guide rail 22a is engaged with the side partition board 21d such that hooks of the engaging portions 21g are hooked in the cutout portions 22a3.

The electronic apparatus provided with the plug-in unit-mounting structure 2 is capable of having a full-size PIU and a half-size PIU mounted on the BWB of the metal shelf 20 using the associated mounting frame 21 for the full-size PIU and the associated mounting frame 22 for the half-size PIU. Further, it is also possible to mount the print circuit board-type PIUs having sizes other than the half-size. The position where the center guide rail 22a is horizontally fixed to the vertical frame part 21c is changed according to the height of the mounted PIU. Then, the center guide rail 22a is fixed to the side partition board 21d and the vertical frame part 21c with the screws 21h by hooking the engaging portions 21g, formed in advance, of the side partition board 21d, in the cutout portions 22a3 of the center guide rail 22a. This method enables the mounting frames to be adapted to PIUs having various heights.

Therefore, in the plug-in unit-mounting structure, to accommodate PIUs in a shelf, the mounting frames which are removably mounted in the shelf for accommodating the PIUs are used, whereby it is possible to efficiently accommodate the PIUs in the shelf by guiding the same along the guide rails provided on the mounting frame. Further, it is possible to provide a center guide rail which is removable from the mounting frame on the mounting frame in a manner adapted to the height of a PIU. Therefore, it becomes unnecessary to perform fixed mounting of PIUs in a factory, reduce the number of manufacturing steps by reduction of the number of types of parts required to be prepared for assembly, and replace mounting frames for replacement of a mounted PIU after shipment.

Second Embodiment

In the first embodiment, the width of the PIU accommodated in the metal shelf is assumed to be the single-size width. In contrast, a second embodiment of the present invention will be described by taking an example of a case where a mounting frame is used which is capable of being adapted to both the single-size width and a double-size width which is twice as large as the single-size width. It should be noted that a metal shelf of a plug-in unit-mounting structure according to the second embodiment is identical to that of the plug-in unit-mounting structure according to the first embodiment, so that the description thereof is omitted.

Figure 6:
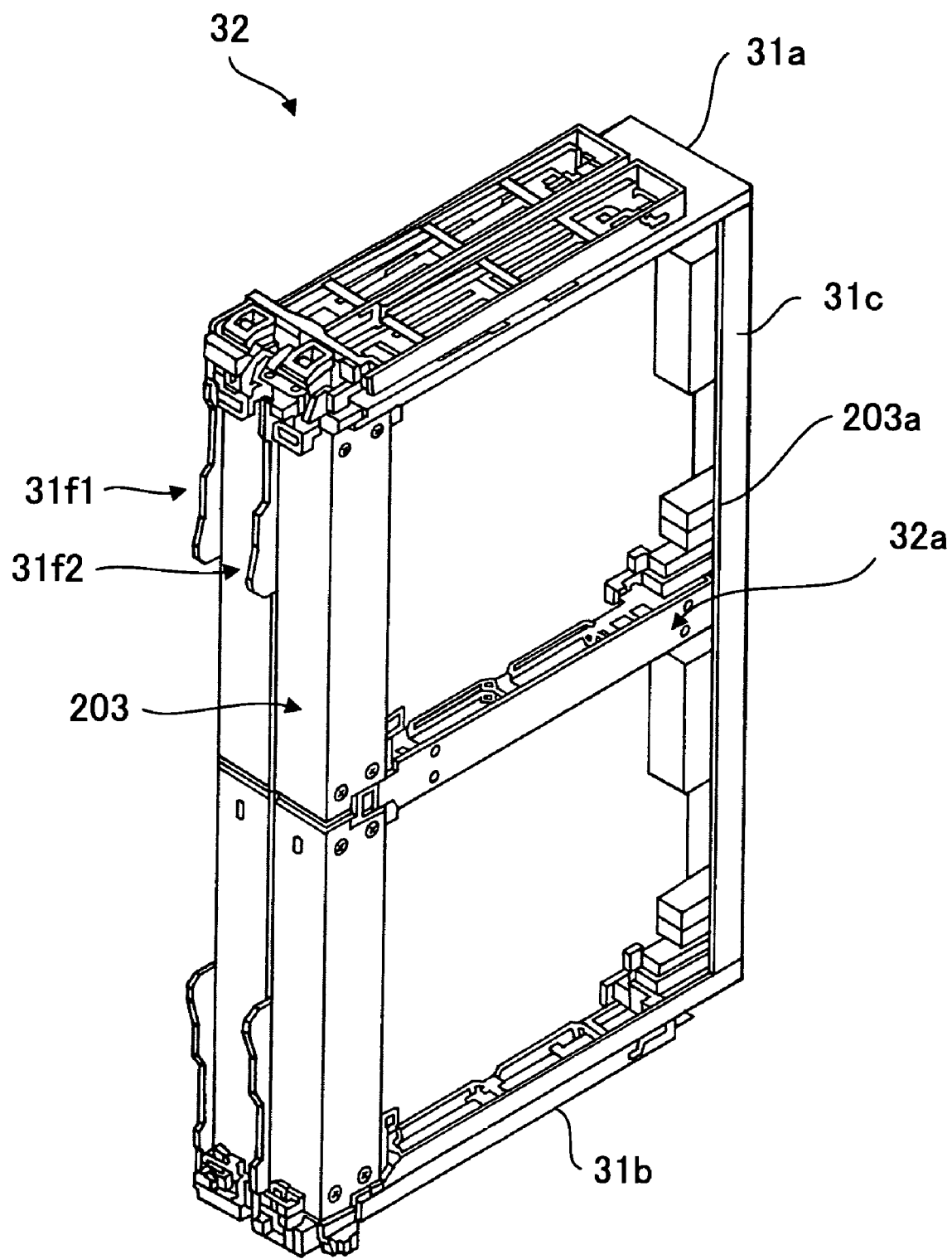
FIG. 6 is a schematic perspective view of a mounting frame of a plug-in unit-mounting structure according to a second embodiment of the present invention.

FIG. 6 is a schematic perspective view of the mounting frame of the plug-in unit-mounting structure according to the second embodiment.

As described above, a mounting frame 32 includes a vertical frame part 31c to be pushed in toward the BWB, an upper frame part 31a and a lower frame part 31b which are horizontally fixed to upper and lower ends of the vertical frame part 31c and have a length corresponding to the depth of the metal shelf 20, with guide rail portions provided thereon for guiding the PIU 203, a pair of card levers 31f1 and 31f2 provided at each of respective front ends of the upper frame part 31a and the lower frame part 31*b*, a side partition board (not shown) which separates the PIU 203 from a PIU mounted adjacent thereto in the metal shelf 20 and is formed with engaging portions (not shown), and a center guide rail 32*a* which is engaged with the engaging portions. It should be noted that the engaging portions have the same shape as those in the first embodiment, and the card levers 31*f*1 and 31*f*2 are provided in two pairs at the front ends of the upper frame part 31*a* and the lower frame part 31*b* in a manner adapted to the number of connectors disposed on the BWB in which the PIU 203 is fitted via the mounting frame 32. Further, the card lever 31*f*2 is removable. Further, the center guide rail 32*a* can be provided on the side partition board in a manner adapted to the height of the mounted PIU, similarly to the first embodiment. Further, in the second embodiment, the vertical frame part 31*c*, the upper frame part 31*a*, the lower frame part 31*b*, and the center guide rail 32*a* have a width corresponding to that of a laminate of two PIUs, i.e. "the double-size width" which is twice as large as the width of those used in the first embodiment. Therefore, as shown in FIG. 6, the mounting frame 32 is capable of having four PIUs mounted therein which have the half-size height and the single-size width. It should be noted that a front panel is omitted from the illustration of the PIU 203 in FIG. 6.

Further, in the mounting frame 32, by setting the width of the center guide rail 32*a* to the single-size width, it is possible to mount two PIUs 203 having a half-size height and the single-size width, or one PIU having the full-size height and the single-size width.

Figure 7:
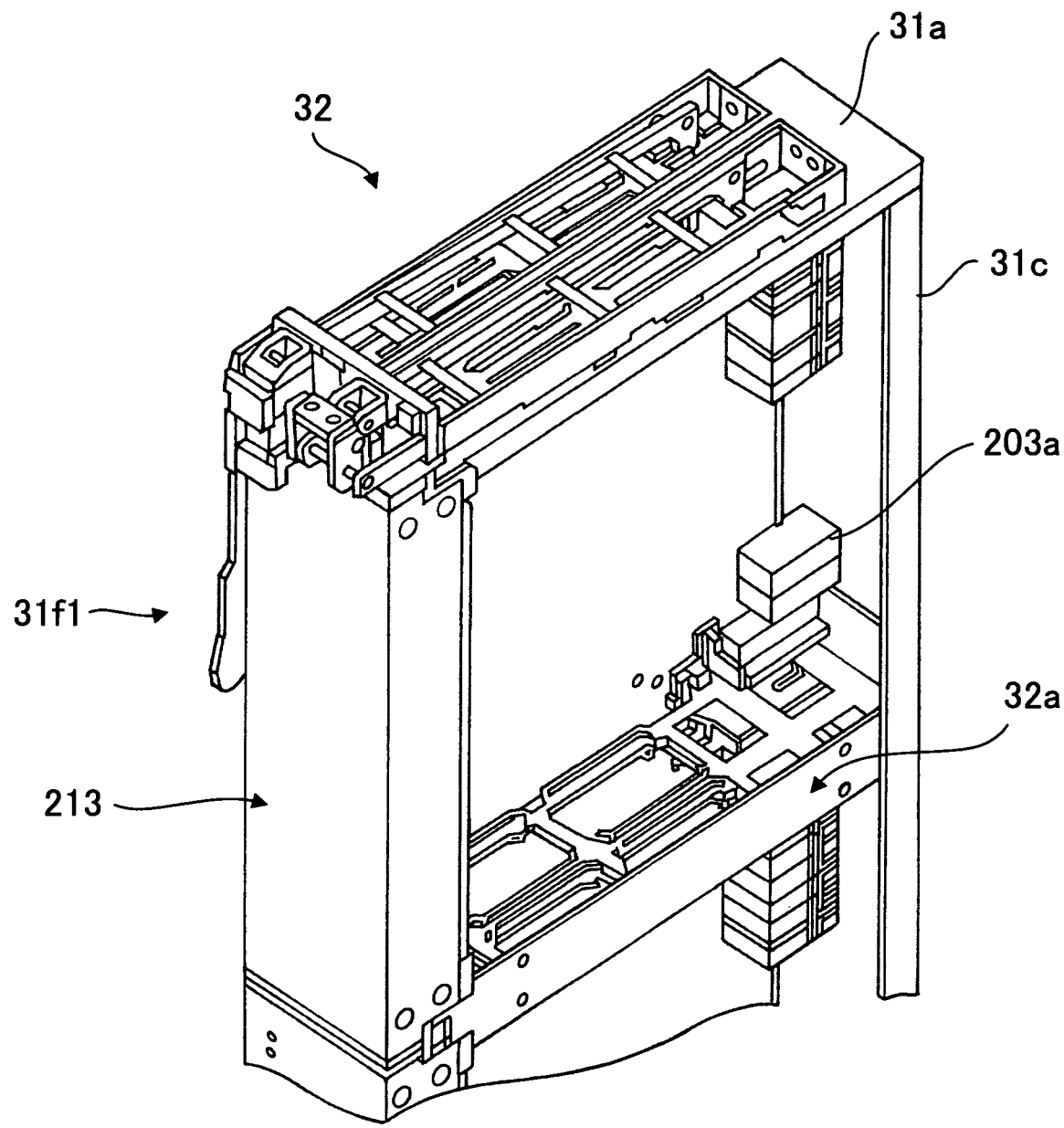
FIG. 7 is a schematic perspective view of essential parts of another mounting frame of the plug-in unit-mounting structure according to the second embodiment.

FIG. 7 is a schematic perspective view of essential parts of another mounting frame of the plug-in unit-mounting structure according to the second embodiment.

The mounting frame 32 is capable of mounting two PIUs 213 having the half-size height and the double-size width. It should be noted that the mounting frame 32 is provided with only a card lever 31*f*1 by removing the card lever 31*f*2 from the mounting frame 32, in a manner adapted to a connector mounted on the BWB which is fitted by the PIU 213. It should be noted that the front panel 203*b* is also omitted from the illustration of the PIU 213.

Therefore, according to the plug-in unit-mounting structure, to accommodate the PIUs in the shelf, the mounting frame removably mounted in the shelf for accommodating the PIUs is used, whereby it is possible to efficiently accommodate the PIUs by guiding the same along the guide rails provided on the mounting frame. Further, it is possible to flexibly provide a center guide rail removable from the mounting frame in a manner adapted to the size of the width of a PIU and the connector to which the PIU is fitted. Therefore, it becomes unnecessary to perform fixed mounting of PIUs in a factory, reduce the number of manufacturing steps by reduction of the number of types of parts required to be prepared for assembly, and replace mounting frames for replacement of a mounted PIU after shipment. Further, the variety of the type of the PIU is increased, and it is possible to cope with PIUs various in width and height, without newly manufacturing mounting frames.

Third Embodiment

In a third embodiment of the present invention, a description will be given by taking as an example a case in which a mounting frame can be divided and the height thereof is made small.

Figure 8:
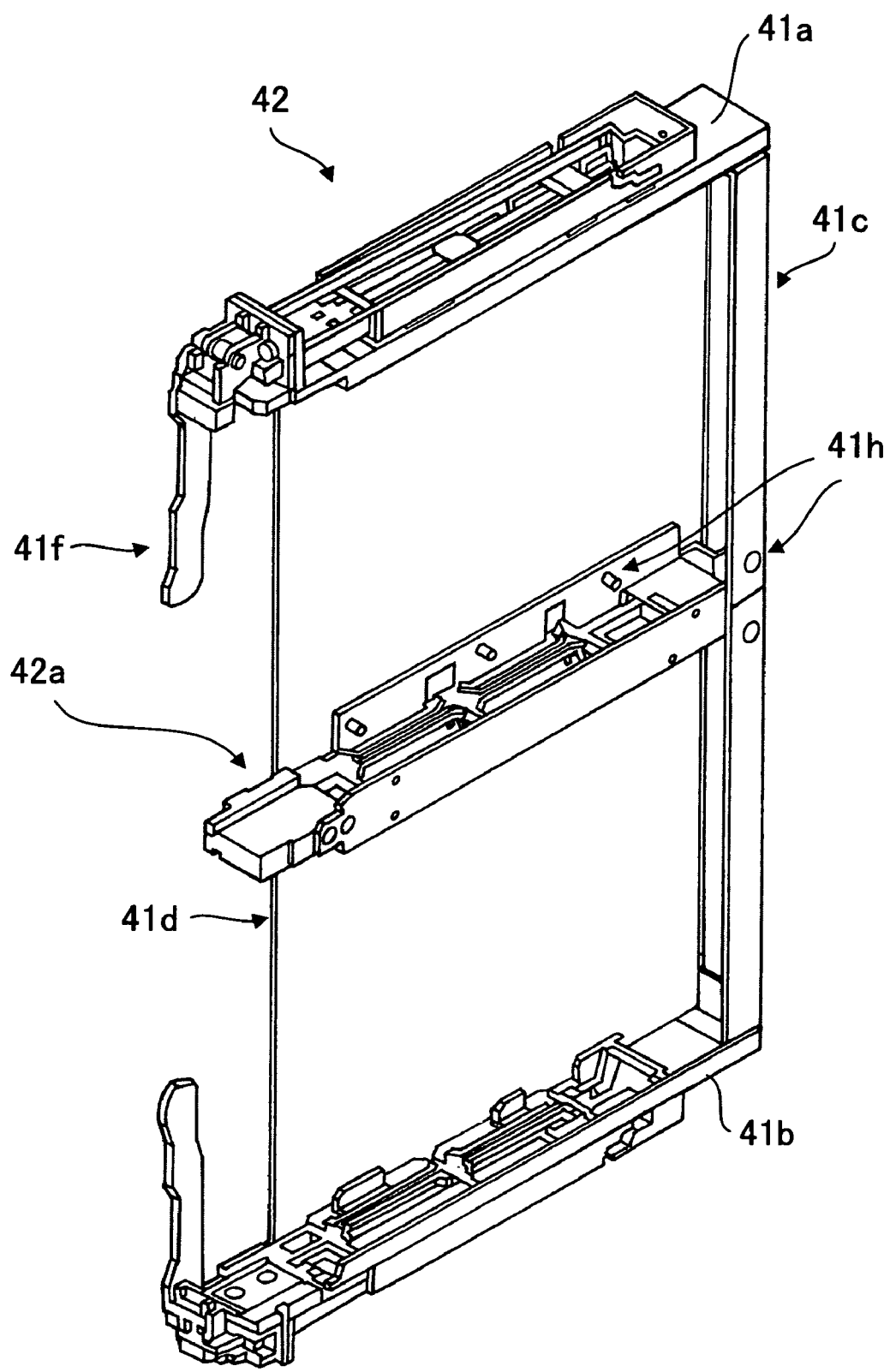
FIG. 8 is a schematic perspective view of a mounting frame of a plug-in unit-mounting structure according to a third embodiment, as viewed from the front side.
Figure 9:
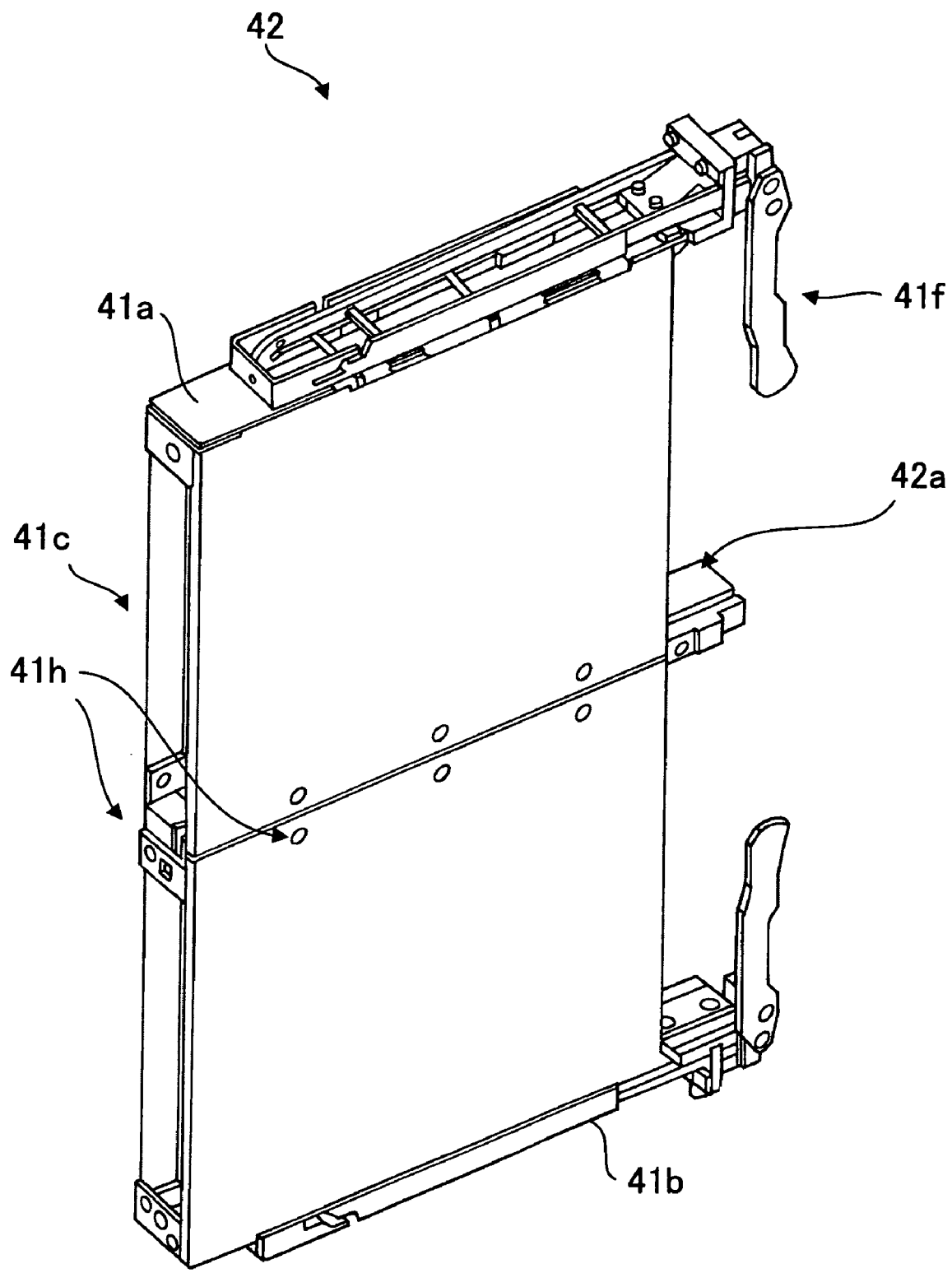
FIG. 9 is a schematic perspective view of the mounting frame of the plug-in unit-mounting structure according to the third embodiment, as viewed from the rear side.
Figure 10:
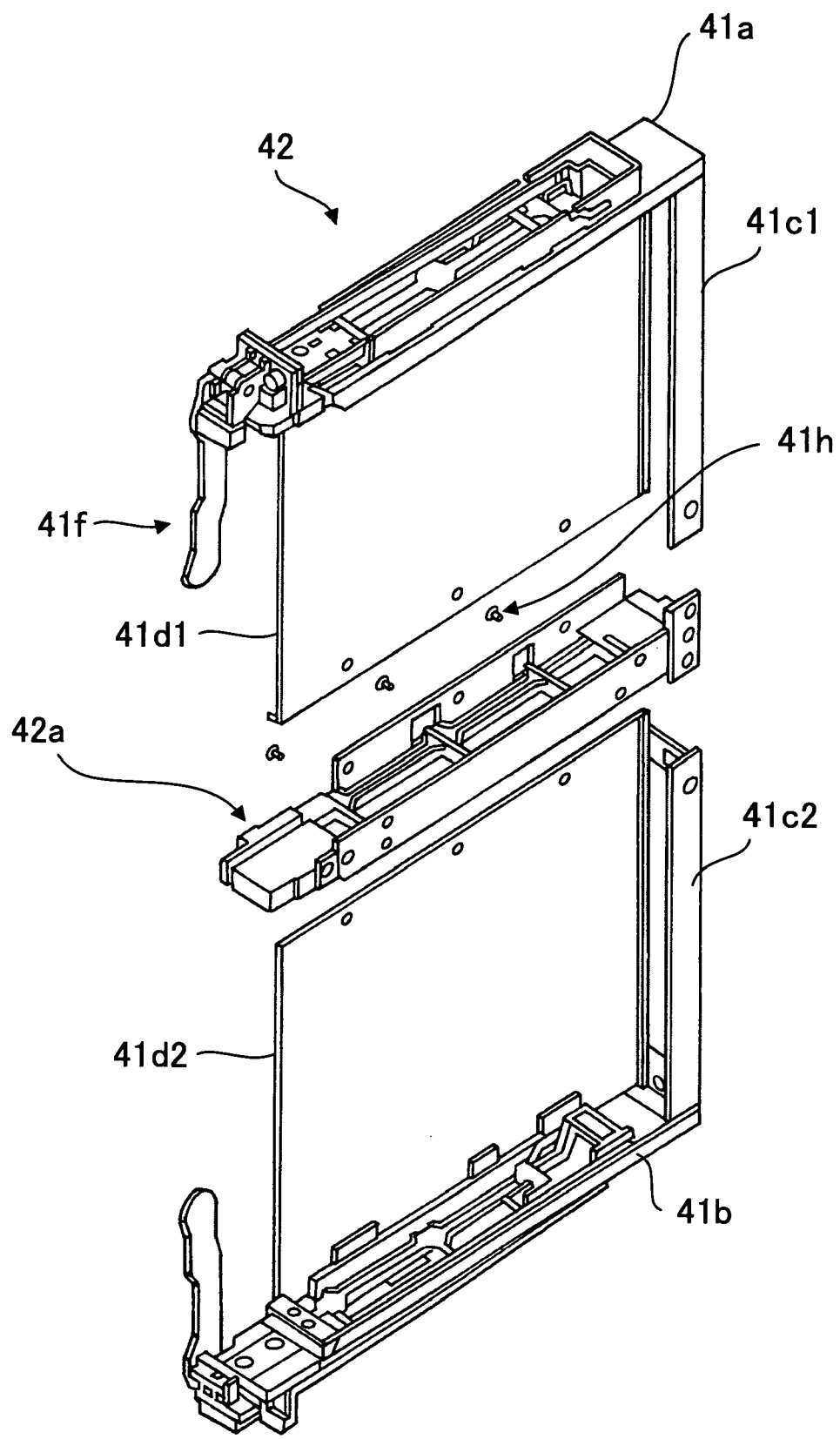
FIG. 10 is a schematic perspective view of the mounting frame of the plug-in unit-mounting structure according to the third embodiment, as viewed from the front side, in a state in which the mounting frame is divided.

FIG. 8 is a schematic perspective view of a mounting frame of a plug-in unit-mounting structure according to the third embodiment, as viewed from the front side. FIG. 9 is a schematic perspective view of the mounting frame according to the third embodiment, as viewed from the rear side. FIG. 10 is a schematic perspective view of the mounting frame of the mounting frame according to the third embodiment, as viewed from the front side, in a state in which the mounting frame is divided. It should be noted that the metal shelf which accommodates a mounting frame 42 in the third embodiment is identical to that in the first embodiment, and hence a description thereof is omitted.

As shown in FIGS. 8 and 9, the mounting frame 42 includes a vertical frame part 41*c* to be pushed in toward the BWB, and an upper frame part 41*a* and a lower frame part 41*b* horizontally fixed to respective upper and lower ends of the vertical frame part 41*c* and having a length corresponding to the depth of the metal shelf 20, with guide rail portions provided thereon for guiding the PIU, card levers 41*f* provided at each of respective front ends of the upper frame part 41*a* and the lower frame part 41*b*, a side partition board 41*d* provided for separation of the PIU from a PIU mounted adjacent thereto in the metal shelf 20, and a center guide rail 42*a*. It should be noted that the mounting frame 42 is assumed to have the half-size PIU 203 mounted thereon. Therefore, an end of the center guide rail 42*a* is located at a substantially central portion of the vertical frame part 41*c*. Further, as shown in FIG. 10, the vertical frame part 41*c* can be divided into an upper vertical frame part 41*c*1 and a lower vertical frame part 41*c*2, and the side partition board 41*d* can also be divided into an upper side partition board 41*d*1 and a lower side partition board 41*d*2. The mounting frame 42 is formed by fixing the upper vertical frame part 41*c*1 and the upper side partition board 41*d*1, and the lower vertical frame part 41*c*2 and the lower side partition board 41*d*2, to the center guide rail 42*a* with screws 41*h*.

As described above, since the mounting frame 42 can be disassembled, it is possible to assemble a mounting frame having a reduced dimension of the height.

Figure 11:
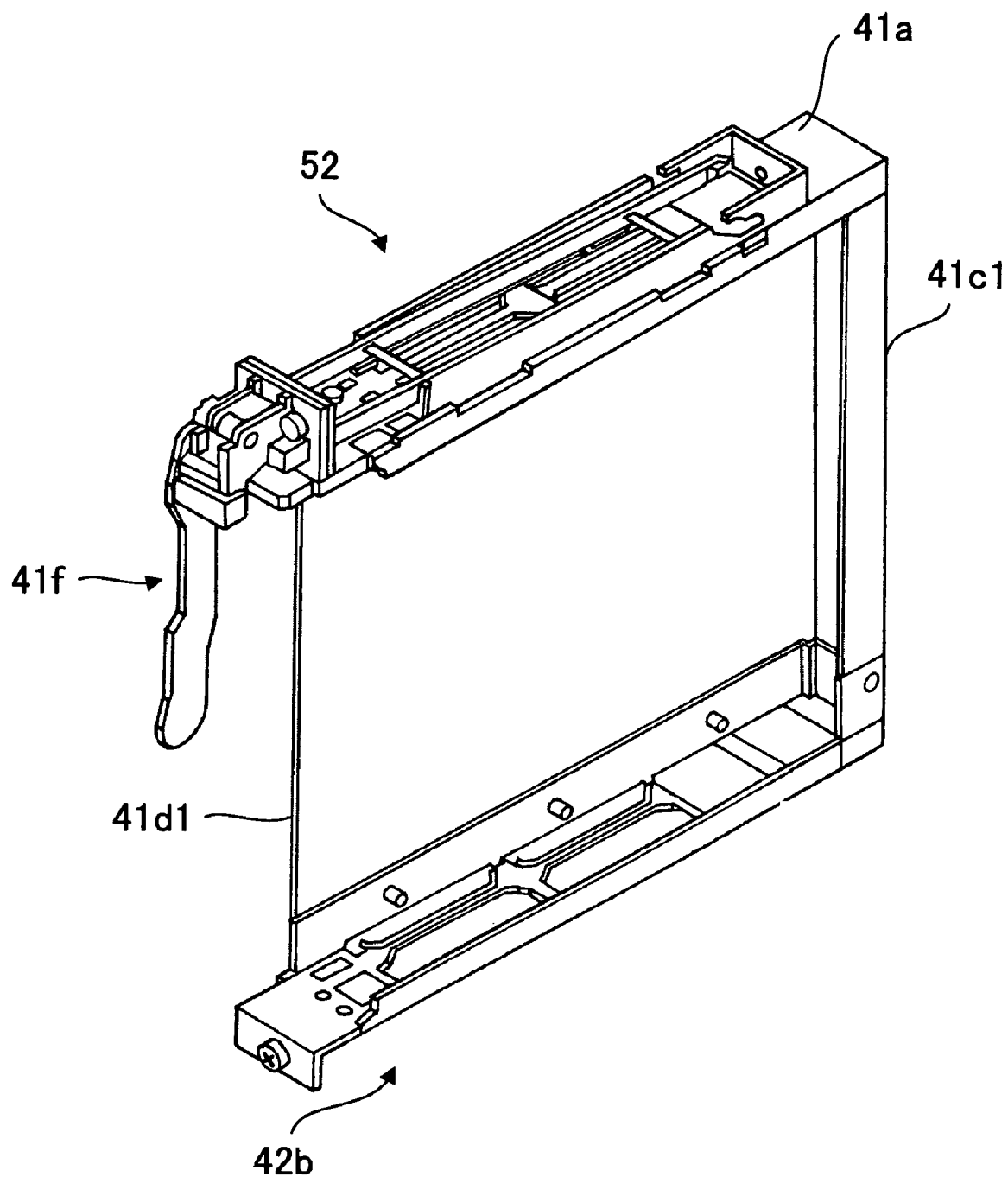
FIG. 11 is a schematic perspective view of another mounting frame of the plug-in unit-mounting structure according to the third embodiment.

FIG. 11 is a schematic perspective view of another mounting frame of the plug-in unit-mounting frame according to the third embodiment.

The mounting frame 52 has a configuration in which the lower vertical frame part 41*c*2, the lower side partition board 41*d*2, and the lower frame part 41*b* are removed from the mounting frame 42. In other words, the mounting frame 52 includes the upper vertical frame part 41*c*1, the upper frame part 41*a* horizontally fixed to the upper end of the upper vertical frame part 41*c*1, with a guide rail portion provided thereon for guiding a PIU, the card lever 41*f* provided at the front end of the upper frame part 41*a*, the upper side partition board 41*d*1, and the guide rail 42*b* in place of the center guide rail 42*a*.

The mounting frame 52 having these components is capable of having only the half-size PIU 203 mounted thereon.

Next, a description will be given of a metal shelf in which the mounting frame 52 is mounted.

Figure 12:
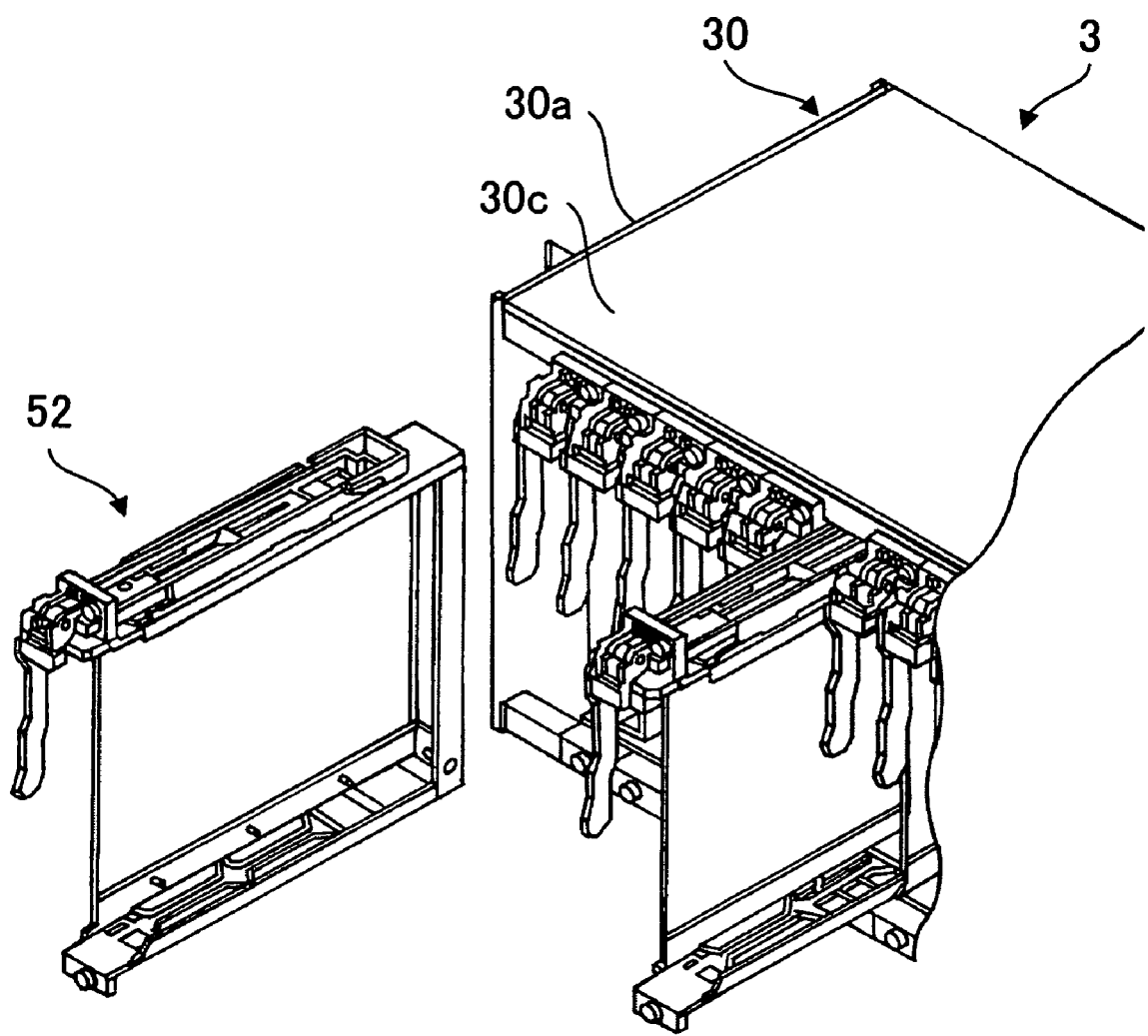
FIG. 12 is a schematic perspective view of a metal shelf for which another mounting frame of the plug-in unit-mounting structure according to the third embodiment is used.
Figure 13:
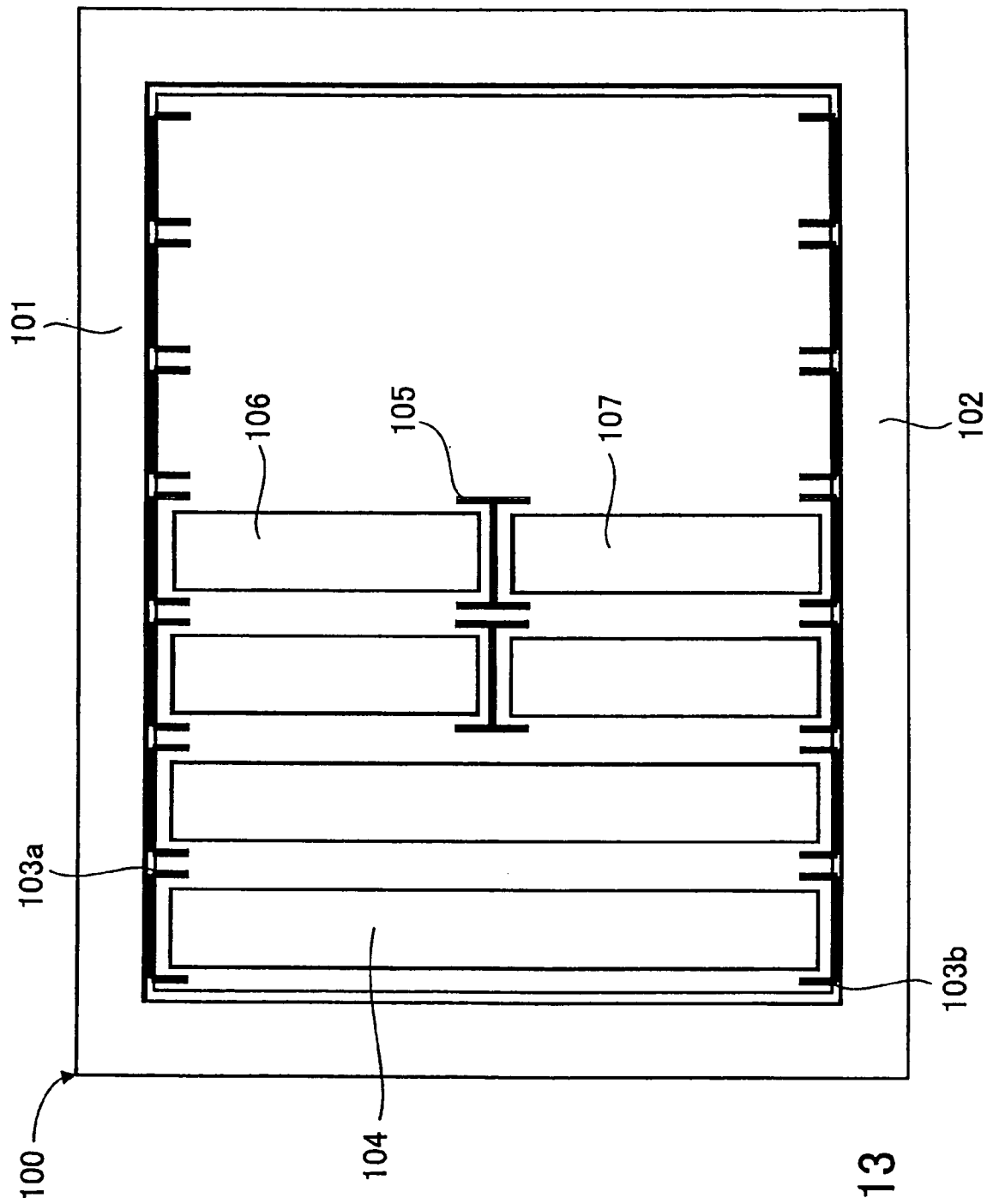
FIG. 13 is a front view of an example of a plug-in unit-mounting structure.
Figure 14:
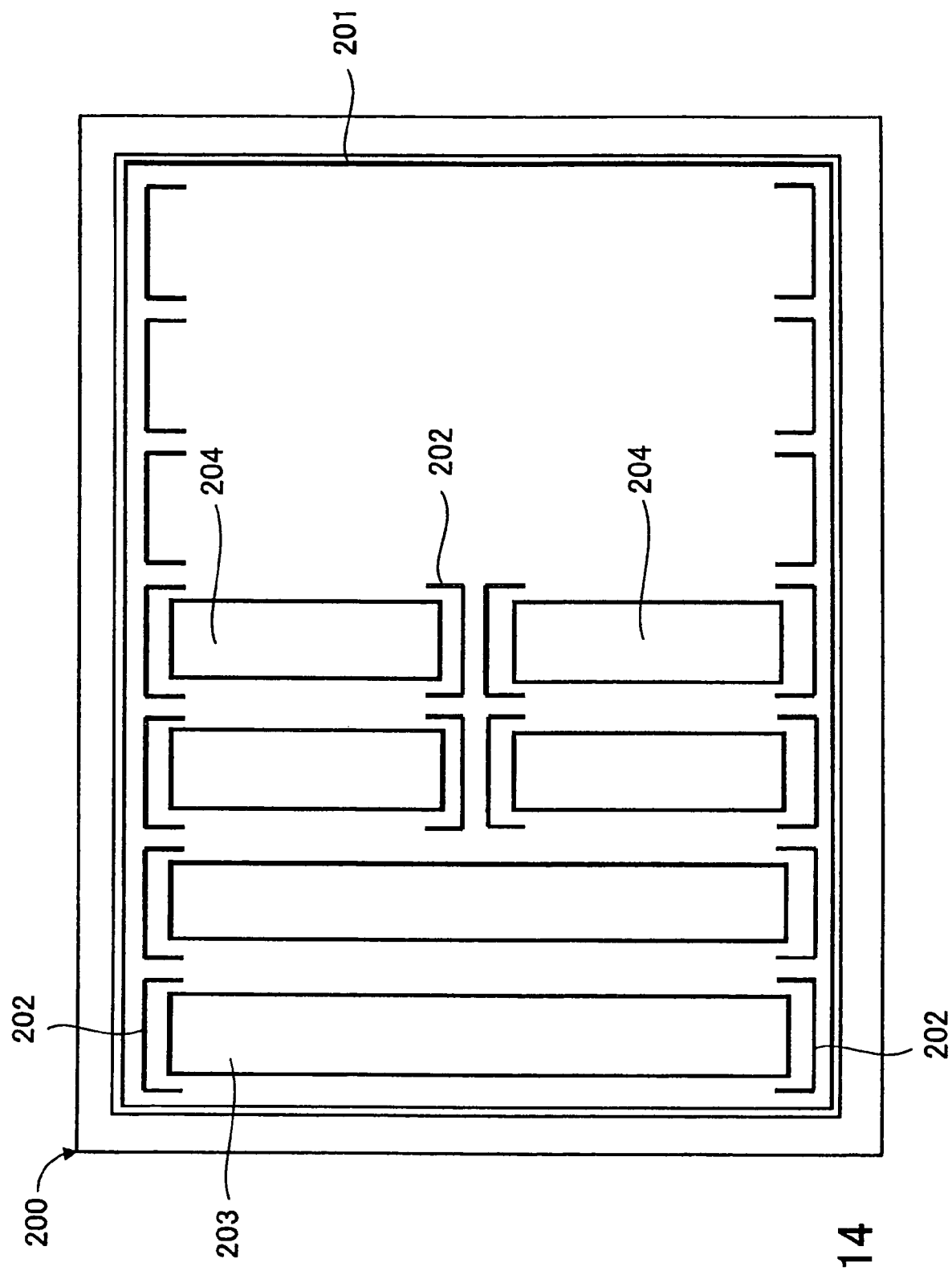
FIG. 14 is a front view of another example of the plug-in unit-mounting structure.
Figure 15:
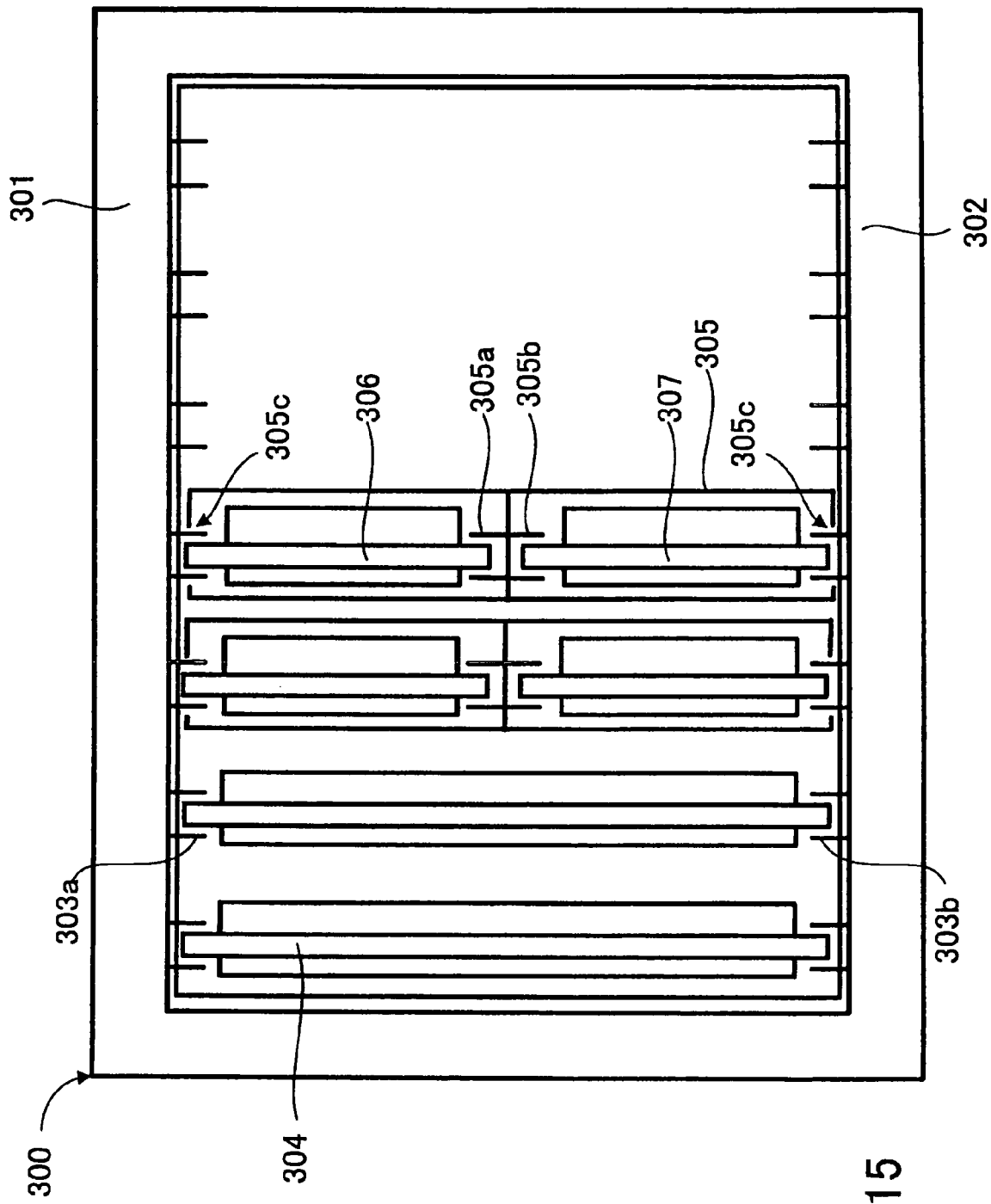
FIG. 15 is a front view of still another example of the plug-in unit-mounting structure.

FIG. 12 is a schematic perspective view of a metal shelf which uses another mounting frame of the plug-in unit-mounting structure according to the third embodiment.

A metal shelf 30 which realizes a plug-in unit-mounting structure 3 accommodates the half-size PIUs 203, and corresponds to a variation of the metal shelf 20 in which the respective heights of the side board 20*a* and the BWB are reduced to half. That is, the metal shelf 30 forms a sub-rack having a pair of side boards 30*a* which are half as high as the side board 20*a*, a bottom board (not shown), a top board 30*c*, and a BWB (not shown). It should be noted that connectors (not shown) are also provided on the BWB.

Although in the third embodiment, the description is given of the case in which the width of the mounting frames 42 and 52 is the single-size width, the mounting frame which has the double-size width may be used. Further, although in the third embodiment, the description is given of the case in which the mounting frame 42 is divided into two parts, the mounting frame may be divided into three or more parts.

Therefore, according to the plug-in unit-mounting structure of the present invention, when accommodating the PIUs in the shelf, the mounting frames are used in the shelf, whereby it is possible to efficiently accommodate the PIUs by guiding the same along the guide rails provided on the mounting frames. Further, the use of the mounting frame makes it unnecessary to provide a metal shelf capable of accommodating half-size or full-size PIUs, with mounting frames adapted to the respective sizes of the PIUs, and hence this makes it possible to reduce the manufacturing costs.

The above-described plug-in unit-mounting structure and electronic apparatus is capable of realizing a plug-in unit-mounting structure which is high in the freedom of configuration.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A plug-in unit-mounting structure for mounting plug-in units having various circuit packages mounted on printed circuit boards thereof, comprising:
   a shelf that has connectors disposed on a back wiring board, for being fitted to the plug-in units; and
   at least one mounting frame that is mounted in said shelf, for each accommodating an associated one of the plug-in units, and enabling the plug-in unit to be inserted in and removed from an associated one of said connectors, said mounting frame being provided with a guide rail which enables a position of disposition of the plug-in unit to be changed according to a size of the plug-in unit.

2. The plug-in unit-mounting structure according to claim 1, wherein said mounting frame includes a vertical frame part to be pushed in toward said back wiring board, an upper frame part and a lower frame part horizontally fixed to respective upper and lower ends of said vertical frame part, and wherein said guide rail is horizontally fixed to a desired position of said vertical frame part.

3. The plug-in unit-mounting structure according to claim 1, wherein said mounting frame is further provided with a partition board for separation from an adjacent one of the plug-in units.

4. The plug-in unit-mounting structure according to claim 3, wherein said partition board is provided with engaging portions, and said guide rail is provided with cutout portions, and wherein said guide rail is fixed by engaging said cutouts portions with said engaging portions.

5. The plug-in unit-mounting structure according to claim 1, wherein said mounting frame and said guide rail have a double-size width corresponding to a width of a laminate of the plug-in units.

6. The plug-in unit-mounting structure according to claim 5, wherein another plug-in unit having the double-size width is accommodated.

7. The plug-in unit-mounting structure according to claim 1, wherein said mounting frame has a card lever provided thereon in association with a front slot of said shelf, for urging the plug-in unit so as to insert and remove the plug-in unit to and from said connector.

8. The plug-in unit-mounting structure according to claim 7, wherein said card lever is removably mounted, and is provided on said mounting frame in association with said connector to which the plug-in unit is fitted.

9. A plug-in unit-mounting structure for mounting plug-in units having various circuit packages mounted on printed circuit boards thereof, comprising:
   a shelf that has connectors disposed on a back wiring board, for being fitted to the plug-in units; and
   at least one mounting frame that is mounted in said shelf, for each accommodating an associated one of the plug-in units, and enabling the plug-in unit to be inserted in and removed from an associated one of said connectors, said mounting frame being provided with a guide rail according to a size of the plug-in unit, and being capable of being divided into an upper part and a lower part by said guide rail.

10. The plug-in unit-mounting structure according to claim 9, wherein said mounting frame includes a vertical frame part which is to be pushed in toward said back wiring board, and has said guide rail horizontally fixed thereto, an upper frame part and a lower frame part horizontally fixed to respective upper and lower ends of said vertical frame part, and wherein said vertical frame part has an upper vertical frame part and a lower vertical frame part connected to each other via said guide rail.

11. The plug-in unit-mounting structure according to claim 10, wherein said mounting frame is divided, the plug-in unit-mounting structure comprising another mounting frame having said upper vertical frame part, said upper frame part horizontally fixed to an upper end of said upper vertical frame part, a guide rail horizontally fixed to a lower end of said upper vertical frame part, and another shelf having said another mounting frame mounted therein, said another shelf having a same height as said upper vertical frame part.

12. The plug-in unit-mounting structure according to claim 9, wherein said mounting frame is further provided with a partition board for separation from an adjacent one of the plug-in units, and wherein said partition board comprises an upper partition board and a lower partition board.

13. An electronic apparatus having various circuit packages mounted on printed circuit boards thereof, comprising:
   a shelf having a back wiring board on which connectors are disposed;
   plug-in units which are capable of being inserted in and removed from said connectors;
   a mounting frame that accommodates an associated one of the plug-in units, said mounting frame being provided with a guide rail which enables a position of disposition of the plug-in unit to be changed according to a size of the plug-in unit, said mounting frame being positioned with respect to said frame and fixed thereto.

* * * * *